(12) United States Patent
Nick et al.

(10) Patent No.: US 9,998,167 B2
(45) Date of Patent: Jun. 12, 2018

(54) RECONFIGURABLE INTEGRATED RF FRONT-END FOR DUAL-BAND WLAN TRANSCEIVERS

(71) Applicant: Marvell World Trade Ltd., St. Michael (BB)

(72) Inventors: Morteza Nick, San Francisco, CA (US); Renaldi Winoto, Danville, CA (US)

(73) Assignee: Marvell World Trade Ltd., St. Michael (BB)

( * ) Notice: Subject to any disclaimer, the term of this patent is extended or adjusted under 35 U.S.C. 154(b) by 146 days.

(21) Appl. No.: 15/209,635

(22) Filed: Jul. 13, 2016

(65) Prior Publication Data

US 2017/0019140 A1 Jan. 19, 2017

Related U.S. Application Data

(60) Provisional application No. 62/191,639, filed on Jul. 13, 2015.

(51) Int. Cl.
| | |
|---|---|
| *H04B 1/40* | (2015.01) |
| *H04B 1/00* | (2006.01) |
| *H04B 1/48* | (2006.01) |
| *H01L 23/66* | (2006.01) |
| *H04B 15/02* | (2006.01) |
| *H04W 88/06* | (2009.01) |

(52) U.S. Cl.
CPC .............. *H04B 1/40* (2013.01); *H01L 23/66* (2013.01); *H04B 1/006* (2013.01); *H04B 1/48* (2013.01); *H04B 15/02* (2013.01); *H04W 88/06* (2013.01); *H01L 2223/6655* (2013.01); *H01L 2223/6677* (2013.01); *H01L 2223/6683* (2013.01)

(58) Field of Classification Search
CPC .................................. H04B 1/40; H04B 1/006
See application file for complete search history.

(56) References Cited

U.S. PATENT DOCUMENTS

| | | | |
|---|---|---|---|
| 8,457,685 B1 * | 6/2013 | Bauder | H04B 1/18 455/553.1 |
| 2014/0009208 A1 * | 1/2014 | Smith | H04B 1/0458 327/391 |

OTHER PUBLICATIONS

International Application No. PCT/IB2016/054189, Notification of Transmittal of the International Search Report and the Written Opinion of the International Searching Authority, dated Sep. 16, 2016, 12 pages.

* cited by examiner

*Primary Examiner* — Tuan H Nguyen (57) ABSTRACT

Systems and techniques relating to wireless communication devices and reconfigurable an integrated RF Front-End for dual-band WLAN transceivers include, according to an aspect, an integrated circuit chip comprising: radio frequency (RF) Front-End circuitry, wherein the RF Front-End circuitry comprises (i) an antenna input line configured to connect with one or more antennas of a wireless communication device, (ii) a transmitter input line, (ii) a first receiver output line, (iii) and a second receiver output line; harmonic trap circuitry coupled with the RF Front-End circuitry via the antenna input line, the harmonic trap circuitry being fully integrated on the integrated circuit chip.

19 Claims, 7 Drawing Sheets

RECONFIGURABLE INTEGRATED RF FRONT-END FOR DUAL-BAND WLAN TRANSCEIVERS

CROSS REFERENCE TO RELATED APPLICATION

This disclosure claims the benefit of the priority of U.S. Provisional Application Ser. No. 62/191,639, filed Jul. 13, 2015, entitled, "Reconfigurable Integrated RF Front End for Dual-Band WLAN Transceivers", which is incorporated herein by reference in its entirety.

BACKGROUND

This disclosure relates to wireless communication devices, namely a wireless local area network (WLAN) transceiver, and circuitry used therein.

Wireless communication, particularly WLAN technology, has become ubiquitous in the mobile computing environment. However, existing wireless networking standards operate in differing RF (radio frequency) bands. For example, WiFi protocol IEEE (Institute of Electrical and Electronics Engineers) 802.11 functions at 2.4 GHz, while IEEE 802.11ac operates at 5 GHz. The increased usage of wireless network products, and the associated wireless communication standards, has propelled a shift in the demand for wireless devices that have functionality in a single band to devices that have multi-band capabilities, such as a WLAN transceiver capable of operating at both 2 GHz and 5 GHz bands.

Currently, dual-band WLAN transceivers include RF Front-End circuitry to process, or otherwise convert, modulated RF signals received at the WLAN antenna into input signals for other modules of the WLAN transceiver. Particularly, a diplexer component is incorporated in RF Front-End implementations, where the diplexer functions to provide frequency domain multiplexing. Therefore, a WLAN transceiver can transmit and receive signals in dual modes, as the diplexer provides tuning for 2G and 5G bands.

SUMMARY

The present disclosure includes reconfigurable integrated RF Front-End for dual-band WLAN transceivers implemented on chip, e.g., with harmonic traps fully integrated on a CMOS (Complimentary-Metal-Oxide-Semiconductor) die. The systems and techniques described herein facilitate the use of integrated Front-End circuitry in wireless communication devices.

According to an aspect of the described systems and techniques, an integrated circuit chip includes: radio frequency (RF) Front-End circuitry, wherein the RF Front-End circuitry comprises (i) an antenna input line configured to connect with one or more antennas of a wireless communication device, (ii) a transmitter input line, (ii) a first receiver output line, (iii) and a second receiver output line; harmonic trap circuitry coupled with the RF Front-End circuitry via the antenna input line, the harmonic trap circuitry being fully integrated on the integrated circuit chip; a transmitter configuration switch coupled between the harmonic trap circuitry and the RF Front-End circuitry via the transmitter input line, wherein the transmitter configuration switch is selectable to configure the integrated circuit chip for transmitting by connecting the transmitter input line with the antenna input line and the harmonic trap circuitry; a first receiver configuration switch coupled between the harmonic trap circuitry and the RF Front-End circuitry via the first receiver output line, wherein the first receiver configuration switch is selectable to configure the integrated circuit chip for receiving by connecting the first receiver output line with the harmonic trap circuitry and the antenna input line; and a second receiver configuration switch coupled between the harmonic trap circuitry and the RF Front-End circuitry via the second receiver output line, wherein the second receiver configuration switch is selectable to configure the integrated circuit chip for receiving by connecting the second receiver output line with the harmonic trap circuitry and the antenna input line.

The described systems and techniques can be implemented in electronic circuitry, computer hardware, firmware, software, or in combinations of them, such as the structural means disclosed in this specification and structural equivalents thereof.

According to yet another aspect of the described systems and techniques, a wireless communication device includes: one or more antennas; a power amplifier; a first low-noise amplifier; a second low-noise amplifier; and integrated device circuitry providing (i) a transmitting path coupling the power amplifier to the one or more antennas, (ii) a first receiving path coupling the one or more antennas to the first low-noise amplifier, and (ii) a second receiving path coupling the one or more antennas to the second low-noise amplifier; wherein the transmitting path comprises a transmitter configuration switch, a first harmonic trap filter, a second harmonic trap filter, and an additional switch, wherein the transmitter configuration switch is selectable to activate the transmitting path; wherein the first receiving path comprises a first receiver configuration switch and the second harmonic trap filter, wherein the first receiver configuration switch is selectable to activate the first receiving path; and wherein the second receiving path comprises a second receiver configuration switch and the second harmonic trap filter, wherein the second receiver configuration switch is selectable to activate the second receiving path

BRIEF DESCRIPTION OF THE DRAWINGS

Like reference symbols in the various drawings indicate like elements.

DETAILED DESCRIPTION

Figure 1A:
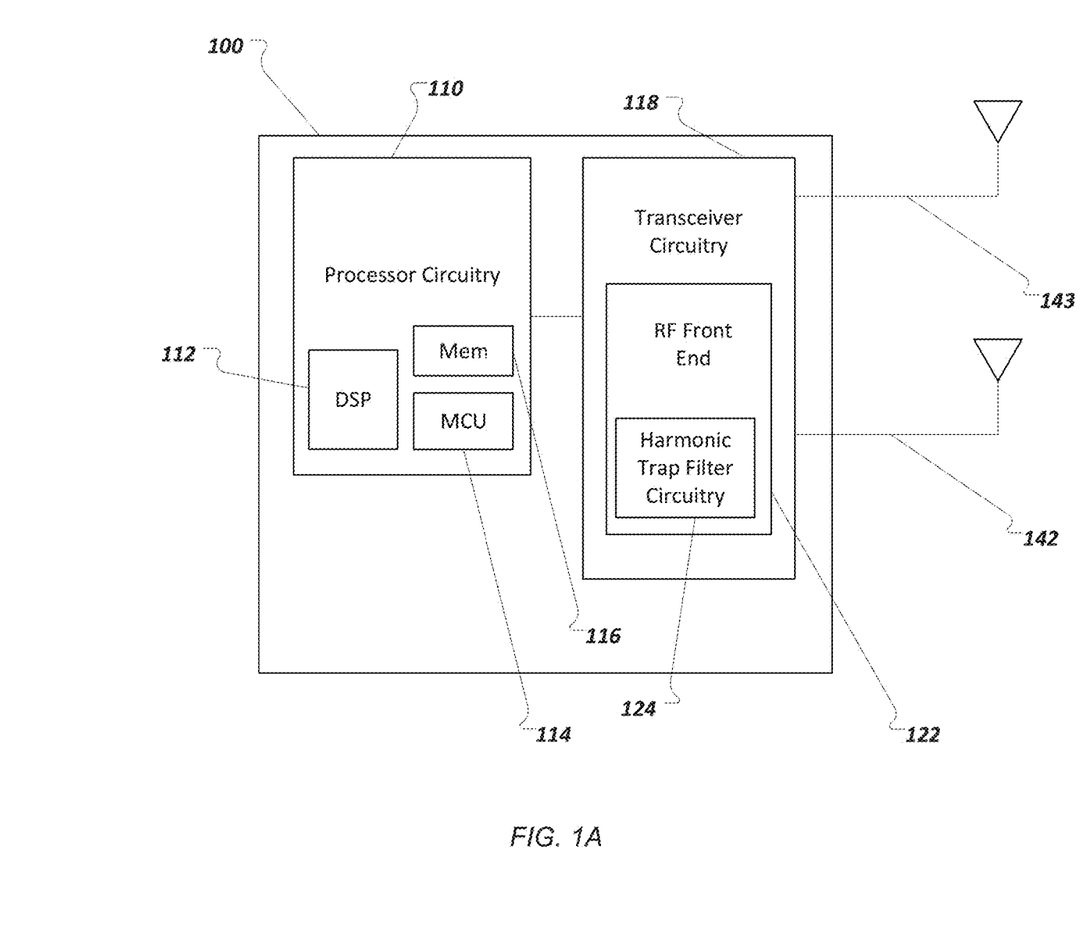
FIG. 1A shows an example of a wireless communication device architecture.

This disclosure provides details and examples of technologies for wireless communications, including a reconfigurable integrated RF Front-End for dual-band WLAN transceivers. FIG. 1A shows an example of a wireless communication device architecture. In accordance with an embodiment of the disclosure, a wireless communication device 100 communicates with one or more other wireless communication devices using one or more antennas 142, 143 and one or more wireless communication technologies (e.g., over a wireless network). The device 100 suitably is a System on Chip (SoC), which includes one or more integrated circuit (IC) devices. The device 100 a single IC device or multiple IC devices that are coupled with each other directly or that are disposed on a common circuit board. In some implementations, the device 100 is an electronic device, such as an access point (AP), base station (BS), wireless headset, access terminal (AT), client station, or mobile station (MS).

The wireless technologies employed can include near field communications (NFC), Bluetooth (BT), WiFi, as well as mobile phone technologies, such as WCDMA (Wideband Code Division Multiple Access), CDMA2000, UMTS (Universal Mobile Telecommunications System), GSM (Global System for Mobile communications), High Speed Packet Access (HSPA), and LTE (Long-Term Evolution, often referred to as 4G). The antennas 142, 143 can include an antenna that is shared by different wireless technologies, one or more antennas that are dedicated to a particular wireless technology, and/or two or more antennas used for a particular wireless technology. For example, in some implementations, a set of antennas 142, 143 can be used for multiple input multiple output (MIMO) communications. The antennas 142, 143 can be implemented to receive and/or transmit specific bands of frequencies, such as dual-band or WiFi/WLAN antennas. In addition, the other wireless device(s) with which the device 100 communicates wirelessly can use the same or different device architecture as device 100.

The wireless communication device 100 includes circuitry that is generally grouped into two main parts that respectively serve generally different functions: transceiver circuitry 118 is configured to send and receive wireless signals over one or more antennas 142, 143; and processor circuitry 110 is configured to process signals that are received and/or transmitted during wireless communications using the transceiver circuitry 118. However, it is noted that the two main parts of the device 100 are shown in FIG. 1A for ease of understanding, and such an explicit separation of components is not required. In some implementations, the device 100 includes dedicated circuitry configurations for transmitting and dedicated circuitry configurations for receiving. The RF Font End 122, including the harmonic trap filter circuitry 124, is configured for utilizing shared circuitry, as certain components of the circuitry of the RF Front-End 122 are employed in the transmitting and/or receiving configurations as discussed in detail in reference to FIGS. 3-5. In addition, in accordance with various embodiments the processor circuitry 110 include one or more processors, such as a digital baseband processor and one or more additional dedicated processing units (e.g., a power management unit and audio codec). In some implementations, the processor circuitry include at least one Digital Signal Processor (DSP) 112, at least one MicroController Unit (MCU) 114, and at least one memory (Mem) device 116 to hold data and potentially instructions for the MCU 114. Many variations on the details of the architecture of the processor circuitry are possible.

The transceiver circuitry 118 possesses the components, circuitry, and architecture necessary to support various wireless communication functions, for example transmitting and/or receiving information via WiFi networking, wireless network access or similar technologies. Operations performed by the transceiver circuitry 118 can include, but are not limited to: signal amplification; modulation/demodulation; synchronization; and channel equalization.

The transceiver circuitry 118 includes, for example, RF Front-End circuitry 122. Furthermore, the RF Front-End circuitry 122 includes harmonic trap filter circuitry 124 that is implemented "on-chip". Further details of the harmonic trap filter circuitry 124 are discussed in reference to FIG. 1B. In particular, the RF Front-End circuitry 122 is configured to process RF signals that are received and/or transmitted from the antennas 142, 143. The RF Front-End circuitry 122 also is employed to further provide the signals as input into, or output from, other components of the transceiver circuitry 118, such as a power amplifier (PA) shown in FIG. 1B. The RF Front-End circuitry 122 operates as an analog-to-digital component for transceiver circuitry 118. For example, the RF Front-End circuitry 122 converts modulated RF signals received by antennas 142, 143 into input signals appropriate for digital processing modules of the transceiver circuitry 118, the processor circuitry 110, or both (e.g., a digital baseband processor). Additionally, the RF Front-End circuitry 122 can be configured to accomplish at least the following signal processing functions, which include, but are not limited to: signal up-conversion/down-conversion; harmonic filtering; and frequency tuning.

The RF Front-End circuitry 122 is designed to implement multiple functions of the RF Front-End circuitry 122 using "on-chip" components. Therefore, various capabilities of the RF Front-End circuitry 122 are integrated onto a single physical microchip, or die. In some implementations, RF Front-End circuitry 122 is fabricated using integrated circuit (IC) technology, such as on a CMOS or silicon germanium (SiGe) die.

The transceiver circuitry 118 functions to transmit and/or receive signals over multiple frequency bands, or specific ranges of frequencies in the RF spectrum. For example, the transceiver circuitry 118 can be implemented as a dual-band WLAN transceiver to support bi-directional communications in multiple wireless communication standards. The transceiver circuitry 118 allow the wireless communication device 100 to connect to an access point of a wireless network, such as a WLAN, in either of the 2.4 GHz and the 5 GHz frequency bands, in an embodiment. Transceiver circuitry 118 include suitable integrated transmitting and receiving circuitry. According to embodiments, described in detail throughout, it is noted that the RF Front-End circuitry 122 architecture supports re-configurability and integration using dedicated circuitry configurations as discussed in detail in reference to FIGS. 3-5.

Figure 1B:
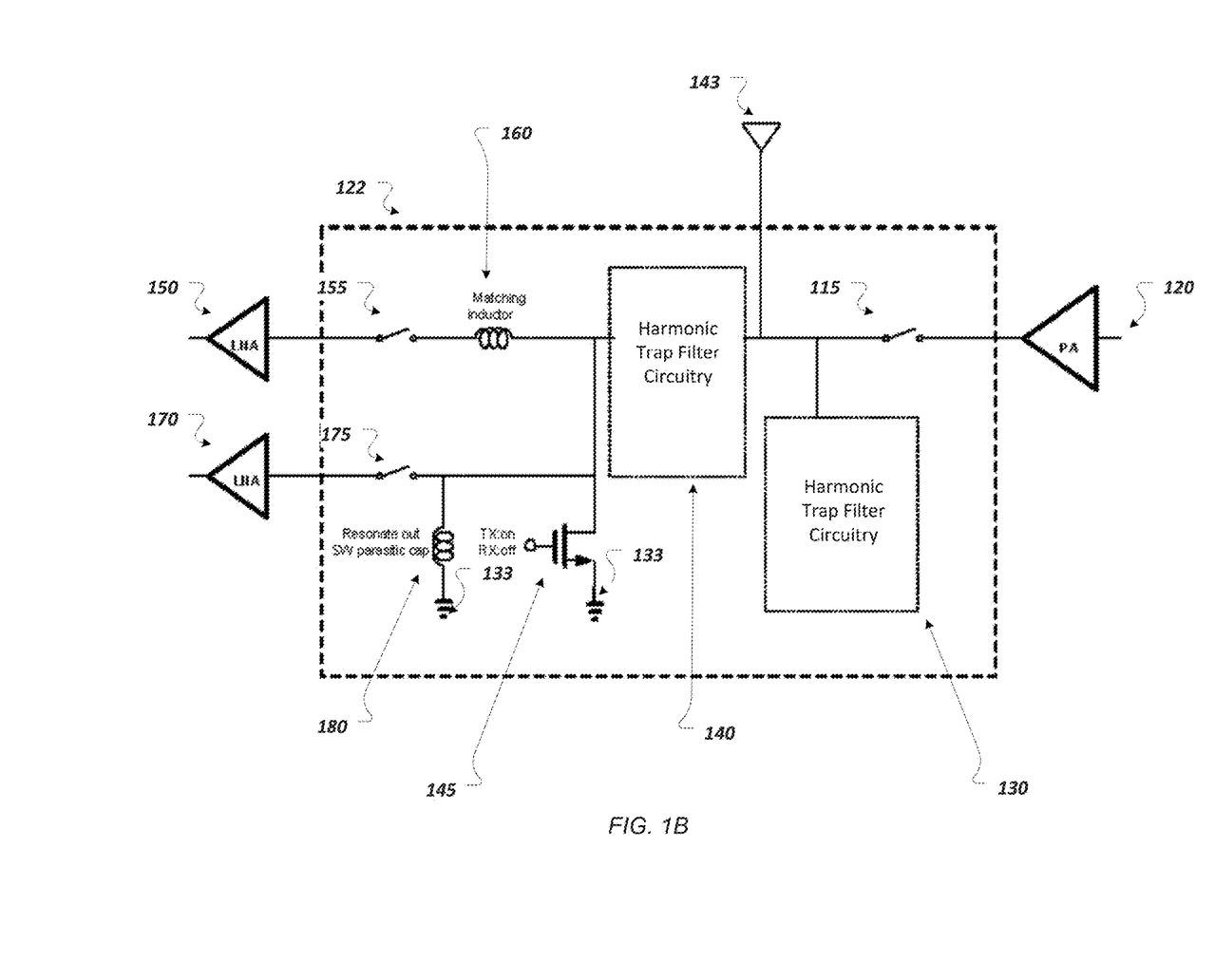
FIG. 1B shows an example of a reconfigurable integrated RF Front-End for dual-band WLAN transceivers as implemented in a wireless communication device architecture.

In FIG. 1B, an example of the RF Front-End circuitry 122 is shown. The RF Front-End circuitry 122 is designed to provide integration of different front end functions onto a single die, as well as support re-configurability of operational components and modes. Some existing RF Front-End systems require distributed modules that are not implemented on a single chip to perform the various signal processing functions of the Front-End. For example, filtering functions in some FR Front-End systems are implemented using SAW (surface acoustic wave) filters. SAW filters are typically not all-electronic resistor-inductor-capacitor (RLC) based filters. SAW filters are based on a piezoelectric material used as a substrate (e.g., such as quartz, lithium niobate, lithium tantalite) capped with a metal layer as an electro-acoustic transducer, thereby necessitating dedicated and/or separate components to perform signal filtering that are not implemented on the same integrated circuit (IC) chip as other portions of the Front-End.

As shown in FIG. 1B, the RF Front-End circuitry 122 includes harmonic trap filters 130 and 140 that are implemented on the same chip and configured to perform the signal filtering aspects of the Front-End capabilities. According to the implementation, the harmonic trap filters 130, 140 are employed to filter distortion that is typically experienced at certain frequencies. The harmonic trap filters 130, 140 reject, or filter out, signals received at frequencies other than the intended operating frequency, such as various harmonic frequencies, in an embodiment. In this implementation, the RF Front-End circuitry 122 achieves a high level of integration, by using "on-chip", e.g., components integrated on a CMOS die, using passive components to implement these filters. For example, the harmonic trap filter circuitry 130,140 is realized completely using passive components, such as inductors and capacitors, which do not require an external source (e.g., supply voltage) for their operation, thus making the filters suitable for integration on an IC chip. As previously discussed, filtering modules for existing RF Front-End architectures are generally realized as separate "off-chip" components in existing wireless transceiver architectures.

As illustrated in FIG. 1B, the harmonic trap filters 130, 140 are coupled to PA 120, via switch 115. PA 120 is configured to amplify an analog signal that is inbound to the RF Front-End circuitry 122, as received from a base band analog-to-digital converter (ADC) for example, the to a desired output level. Thereafter, the PA 120 outputs an outgoing RF, or analog, signal for transmission via antenna 143. The harmonic trap filters 130, 140 are configured to reduce harmonic distortion on the transmission signal by trapping, or otherwise short-circuiting, unwanted harmonic signals that potentially result from amplifying a signal coming into the RF Front-End circuitry 122. The harmonic trap filters 130, 140 employ trap filtering circuitry, in an embodiment. As an example, harmonic trap filter circuitry includes passive filtering components, such an inductor coupled with a capacitor, that are tuned to prevent the propagation of, or otherwise trap, harmonic signals generated at a designed trap frequency. However, in some implementations, it is be suitable for other filtering mechanism to be employed, such as band-pass filtering or notch filtering, based on the desirable filtering characteristics. Further details regarding the In the RF Front-End circuitry 122, harmonic trap filters 130, 140 are implemented using any suitable "on-chip" filtering circuitry for realizing the appropriate unwanted signal rejection and insertion loss for wireless networking standards (e.g., WiFi). In an embodiment, the harmonic trap filters 130, 140 are arranged as a series of two filters, as shown in FIG. 1B. Alternatively, the harmonic trap filters 130, 140 can be implemented as a series of multiple filters, for example a filter bank or array of filters, so as to potentially increase the quality factor (Q factor) of the filter.

The RF Front-End circuitry 122 includes switches 115, 155, and 175 that support a frequency-based separation of signals within the circuit configuration. The switches 115, 155, and 175 are utilized in RF Front-End circuitry 122 to direct, or otherwise route, transmit and/or receive signals to the appropriate path based within RF Front-End 122 based on the corresponding frequency band of the signal. As seen in FIG. 1B, distinct signal paths are implemented within the RF Front-End circuitry 122.

RF Front-End circuitry 122 has three signal paths that respectively correspond to one of three distinct operational configurations. The three signal paths of the RF Front-End circuitry 122 include: a transmitting path; a first receiving path (e.g., for receiving signals in 2G band); and a second receiving path (e.g., for receiving signals in 5G band). The paths are distinct, and the RF Front-End circuitry 122 functions to isolate signals routed on the transmission path from signals traversing a receiving path. Additionally, the RF Font End circuitry 122 is configured to provide the three operational configurations including: a TX (i.e., transmit) mode corresponding to the transmission path; a RX (i.e., receive) 2 GHz mode corresponding to the first transmission path; and a RX 5 GHz mode corresponding to the second transmission path. Therefore, the RF Font End circuitry 122 is re-configurable (e.g., employing the circuit components associated with the selected signal path) based on the intended function of the Front-End. For example, the signal path and circuit components employed during transmission (shown in FIG. 3) differs from the signal path and circuit components employed during receiving a signal within a 2G bandwidth (shown in FIG. 4). On a single-chip, the RF Font End circuitry 122 provides both multi-mode (i.e. TX mode and RX mode) and multi-band (i.e., 2 GHz and 5 GHz) capabilities. Implementing integrated RF front-end circuitry for dual-band WLAN transceivers (e.g., using CMOS chip technology) can utilize less circuitry than RF front-end architectures which employ discrete "off-chip" components. Thus, the RF Front-End circuitry 122 can reduce costs, increase the level of integration of functionality on die, reduce power consumption, as well as contribute to smaller circuitry area. This can potentially result in smaller wireless communication devices.

The RF Front-End circuitry 122 is configured to be coupled to LNA (low-noise amplifier) 150 and LNA 170, in an embodiment. The LNAs 150, 170 are employed to amplify signals received by an antenna 143, for example, without substantially distorting the signal with added noise. In some implementations, the LNAs 150, 170 are designed to maintain a certain SNR (signal-to-noise) ratio deemed to be acceptable in various wireless communications standards. As shown in FIG. 1B, the LNAs 150,170 are implemented as components external to the RF Front-End circuitry 122. In some implementations, LNAs 150,170 are implemented on one or more IC chips (e.g., "on-chip" with the RF Front-End circuitry 122) including system on chip (SoC) implementations.

As shown in FIG. 1B, the LNAs 150, 170 function as stand-alone amplifiers, where each LNA is dedicated for use in a particular frequency band. For example, LNA 150 is configured to amplify signals within a first frequency band (e.g., 2 GHz), and LNA 170 is configured to amplify signals within a second frequency band (e.g., 5 GHz). Thus, the LNAs 150, 170 operate independently in the RF Front-End circuitry 122 configurations according to the selected frequency band (e.g., 2G RX mode configuration and 5G RX mode configuration).

The RF Front-End circuitry 122 further includes inductor 160. The inductor 160 is connected in series to LNA 150, via switch 155. Also, the inductor 160 is coupled to at least one harmonic trap filter 140, for example. As a result of coupling the inductor 160 with the harmonic trap filter 140, the inductor 160 is also arranged to be utilized as a component in frequency matching for LNA 150. Thus, for example, inductor 160 is a 2G matching inductor employed in receiving signals in the 2 GHz band. In some implementations, multiple inductors, or multiple impedance matching networks, is coupled to either, or both, LNAs 150, 170 so as to produce a matching impedance from RF Front-End circuitry 122.

An NMOS (N-type metal-oxide-semiconductor) transistor 145 is included in RF Front-End circuitry 122. The NMOS transistor 145 functions as a switch that is either in an "on" state (e.g., having the properties of a closed circuit) or "off" state (e.g., having the properties of an open circuit), within the RF Front-End circuitry 122. The NMOS transistor 145 is turned ON in the Front-End circuitry 122 configuration which implements TX mode, in an embodiment. Conversely, the NMOS transistor 145 is turned OFF in both configurations of the RF Front-End circuitry 122 corresponding to receiving operations (e.g., 2G RX mode and 5G RX mode). The NMOS transistor 145 is coupled between at least one filter, for example harmonic trap filter 140, and ground 133.

As shown in FIG. 1B, the RF Front-End circuitry 122 includes inductor 180. The inductor 180 is coupled with NMOS transistor 145 and ground 133, and the inductor 180 is configured to cancel out the effects of parasitic capacitance that can be experienced in the RF Front-End circuitry 122. Circuit elements, for example NMOS transistor 145, can be associated with an unintentional capacitance that is generated due to various internal characteristics of the elements. For example, parasitic capacitance dissipates from a NMOS transistor resulting from capacitances experienced at internal junctions, such as the depletion regions between source/drain and bulk or depletion capacitances between the channel and bulk. NMOS transistor 145 is turned OFF, the inductor 180 is coupled to a collector terminal of the transistor 145 and ground 133 via the receiving path, and is active as a shunt inductor employed to resonate out any parasitic capacitance.

Figure 2:
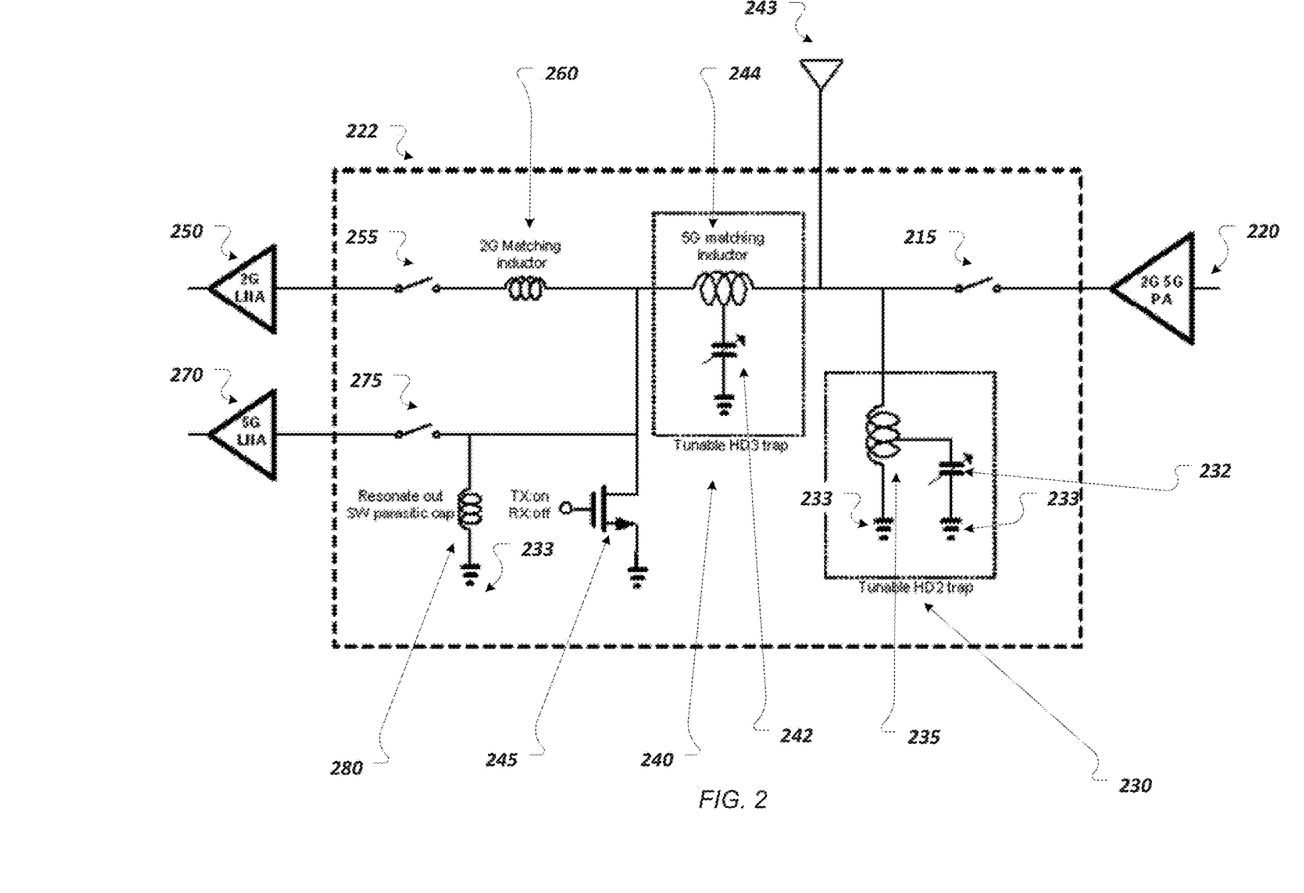
FIG. 2 shows further details of an example of a reconfigurable integrated RF Front-End for dual-band WLAN transceivers including details of the harmonic trap filters.

FIG. 2 shows further detail of an example of RF Front-End circuitry 222. According to one or more implementations, the harmonic filter functions of the RF Front-End circuitry 222 are performed by tunable HD2 trap filter 230 and tunable HD3 trap filter 240. The tunable harmonic trap filters 230, 240 are implemented to reduce, or otherwise reject, harmonic distortions that can be received on a transmission path of RF Front-End circuitry 222. For example, signals at frequencies other than an intended operation frequency (e.g., 2 GHz and 5 GHz) output from PA 220 that distort the integrity of the intended signal are filtered by tunable trap filters 230,240.

FIG. 2 illustrates tunable harmonic trap filter 240 including a variable capacitor 242 that is coupled between inductor 244 and ground 242. An additional tunable harmonic trap filter 230 is shown in FIG. 2 to include an inductor 235, which is connected to ground 233. The inductor 235 is coupled together with a variable capacitor 232 that is connected to ground 233. The tunable harmonic trap filters 230, 240 are configured to divert harmonics from further propagating along the transmission path using a low impedance path, or short path, between active components of the tunable harmonic trap filters 230, 240 and ground 233.

Specifically, the tunable harmonic trap filters 230, 240 are tuned for trapping distortion signals received at particular harmonic frequencies. The tunable HD2 trap 230 is configured to filter the second harmonic of the signal routed from PA 220. Tunable HD3 trap 240 is configured to filter the third harmonic of the signal routed from PA 220. Signals are routed from tunable harmonic trap filters 230,240 and propagating to antenna 243 for transmission. In some implementations, the RF Front-End circuitry 222 is implemented to filter other harmonic variations in addition to the third and second, such as a fifth harmonic, as deemed appropriate.

In an embodiment, the tunable harmonic trap filters 230, 240 are configured as filters that are implemented using only passive components (i.e., inductors and capacitors) which are disposed "on-chip". The tunable harmonic trap filters 230, 240 are implemented using a filter network of LC (inductor and capacitor) elements, in an embodiment. As shown in FIG. 2, tunable harmonic trap filters 230, 240 include inductors 235, 244 and variable capacitors 232, 242, respectively. The variable capacitors 232, 242 are control elements employed for providing filters with various tuning ranges (i.e., range of accepted signal frequencies) and high Q factors usable in transceivers operating at high frequencies, such as WLAN transceivers. Variable capacitors possess characteristics (e.g., impedance characteristics of a dielectric layer) that vary with an applied DC voltage causing changes in the capacitors' operational capacitance over a range of capacitance values. Therefore, implementing tunable harmonic trap filters 230,240 with variable capacitors 232, 242 support varying capacitance values that yield a desired passband filter response, such as changing the center frequency of the filter while maintaining a given bandwidth.

The tunable harmonic trap filters 230, 240 are configured in a trap resonator circuit architecture, which implements the trap filtering capability. Tunability aspects of the tunable harmonic trap filters 230, 240 involve selecting the RF signal corresponding to a desired passing frequency, and removing, or otherwise filtering, unwanted signals received at various other frequencies. For example, the tunable harmonic trap filters 230, 240 are configured to accept signals within frequency bands deemed desirable for WLAN communication (e.g., 2G and 5G), and therefore implemented for tunability between 2G and 5G bands. Tuning of filters 230,240 is controlled by selecting values, or ranges of values, for the variable capacitors and series inductors within each the filters 230,240. The tunable harmonic trap filters 230,240 are designed to support the Q factor deemed appropriate for dual-band wireless transceivers.

As shown in FIG. 2, the tunable harmonic trap filters 230, 240 each of which has an adjustable capacitance, in an embodiment. By adjusting the capacitance values of variable capacitors 232 and 242 filtering characteristics, such as filtering frequency, of the tunable harmonic trap filters 230, 240 are changed. Those RF signals output from PA 220 at one or more of the intended frequencies, namely those frequencies that are not trapped by the tunable harmonic trap filters 230, 240, continue on the transmission path to antenna 243. By adjusting the capacitance of variable capacitors 232 and 242, the tunable harmonic trap filters 230, 240 are reconfigurable and tunable to filter out different harmonics prevalent in the different frequency bands of dual-band WLAN transceivers. Moreover, in some implementations, the tunable harmonic trap filters 230, 240 provide tunability between the 2 GHz and 5 GHz bands by further employing capbank circuitry elements, as shown in more detail in FIG. 6. Therefore, the RF Front-End circuitry 222 architecture integrates frequency band tunability and filtering capabilities by implementing the tunable harmonic trap filters 230, 240 "on-chip". The harmonic trap filters 230, 240 are implemented so as to support the Q factor deemed appropriate for a dual-band wireless transceiver.

FIG. 2 further shows an example of RF Front-End circuitry 222 including inductor 280. The inductor 280 is employed to resonate out, or otherwise cancel out a reactance (e.g., energy dissipated) of the NMOS transistor 245 in instances where the transistor acts as a reactive component (e.g., storing and dissipating energy). As an example, when NMOS transistor 245 is turned OFF, a parasitic capacitance, or dissipation of capacitance, typically occurs at the transistor. In the example, inductor 280 is coupled to NMOS transistor 245, via the receiving path (shown in FIG. 5), and is thereby active as a shunt inductor cancelling out any parasitic capacitance resulting from NMOS transistor 245 that is dispersed along the path from antenna 243 to amplifier 270.

In an embodiment, integrated RF Front-End circuitry 222 is configured to overcome various constraints associated with employing "on-chip" components as filtering structures, rather than utilizing filtering modules that are disposed on a PCB on which the chip is mounted.

Figure 3:
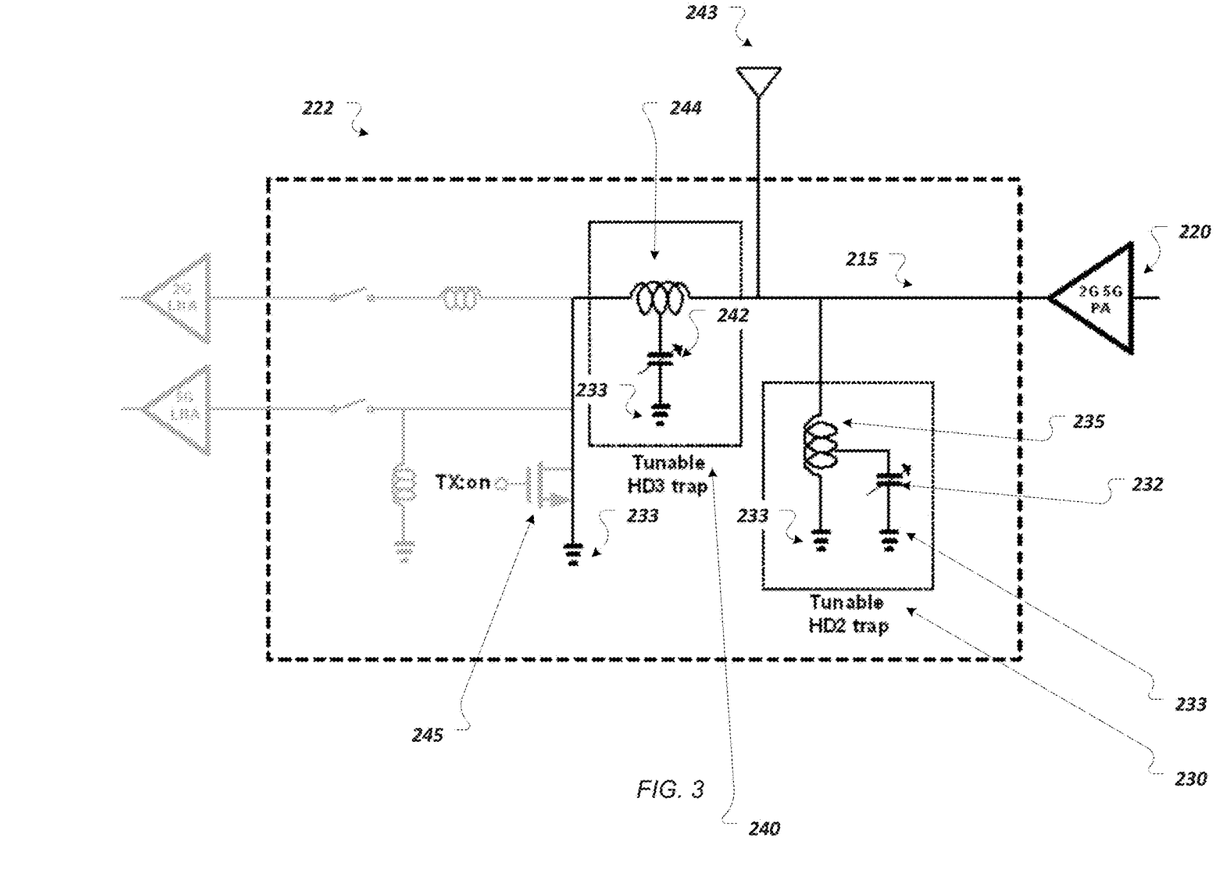
FIG. 3 shows an example of a circuit configuration of a reconfigurable integrated RF Front-End in transmit mode for dual-band WLAN transceivers.

FIG. 3 shows an example RF Front-End circuitry 222 in which a TX mode of operation is selected. The RF Front-End circuitry 222 includes a switch 215 that is shown in a closed, or ON, switch position corresponding to when a TX mode is selected. TX mode, or transmitting mode, for the RF Front-End circuitry 222 is configured for transmission of an outgoing RF signal from antenna 243 to a wireless network, for example a WLAN. In response to turning switch 215 ON, a signal path is formed between PA 220, the RF Front-End circuitry 222, and antenna 243. Additionally, in FIG. 3, NMOS transistor 245 is also shown in its ON position (indicated by a closed switch position), or is otherwise active, in the RF Front-End circuitry 222 configuration for TX mode. The RF Front-End circuitry 222 receives output from PA 220, as switch 215 forms the signal path to antenna 243. The transmitting path signal propagated from PA 220 to antenna 243, or transmit signal, is an up-converted RF signal and is receivable in any suitable frequency within one of the operational frequency bands, such as 2 Ghz and 5 GHz for a dual-band WLAN transceiver, in an embodiment.

The transmission path of RF Front-End circuitry 222 includes the tunable harmonic trap filters 230, 240. In TX mode, the transmit signal is further propagated along the transmission path to the tunable HD2 trap filter 230 and/or tunable HD3 trap filter 240. In this configuration, the transmitting path is configured to provide a short path, or short-circuit, for filtering out distortion signals in the second harmonic frequencies or the third harmonic frequencies of the desired frequency bands. Specifically, NMOS transistor 245 operates as a switch (shown in the closed switch position), thereby connecting the transmitting path to ground 233. The NMOS transistor 245 functions in concert with the elements of tunable HD3 trap 240, namely inductor 244 and variable capacitor 242, implementing the short path to ground for any distortion signals received by the RF Front-End circuitry 222 in the third harmonic frequencies. The filtering components of tunable HD2 trap 230, including inductor 235 and variable capacitor 232, provide a short path to ground 233 for any distortion signals received by the RF Front-End circuitry 222 in the second harmonic frequencies.

Figure 6:
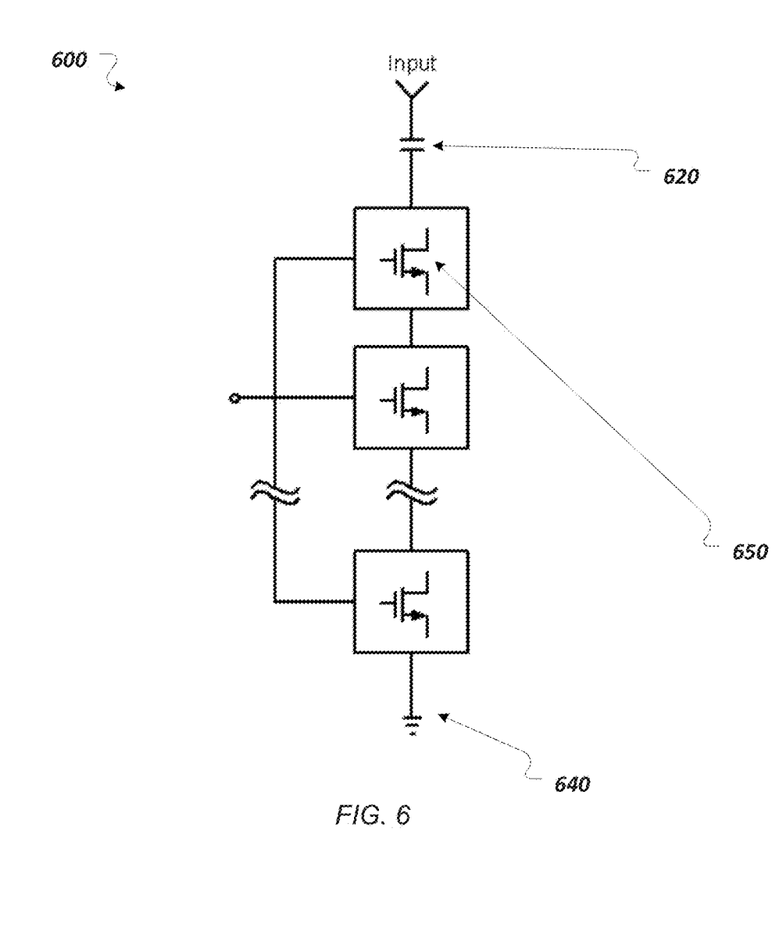
FIG. 6 shows an example of a capacitor bank circuit configuration included in a reconfigurable integrated RF Front-End for dual-band WLAN transceivers.

In this implementation, the NMOS transistor 245 (shown in closed switch position) is further configured to control the voltage swing (e.g., the range of voltages for the signal) on the receiving paths of the RF Front-End circuitry 222 configurations, which correspond to RX mode functions. Thus, RF Front-End circuitry 222 architecture in TX mode is designed to provide no stress on the components included exclusively on the receiving paths, while performing transmission functions. Furthermore, in an embodiment, when in TX mode the RF Front-End circuitry 222 is configured to support multiplexing, or tuning, between the operational frequency bands, such as 2 GHz and 5 GHz, during transmission by further employing capbank circuitry elements, as shown in FIG. 6. Thus, the RF Front-End circuitry 222 shown in FIG. 3 supports dual-mode operation of a wireless device, for example a WLAN transceiver, during transmission.

Figure 4:
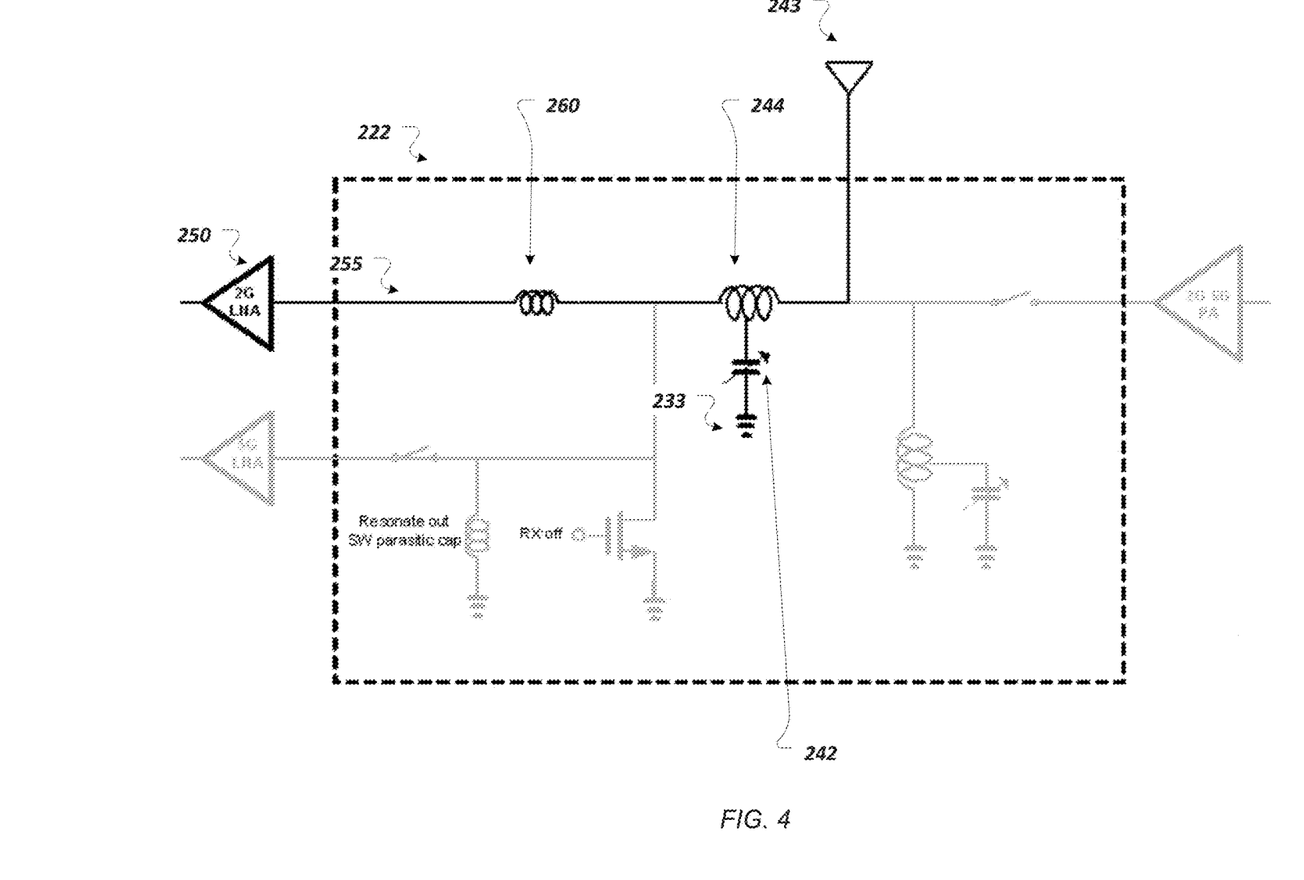
FIG. 4 shows an example of a circuit configuration of a reconfigurable integrated RF Front-End in a frequency band receive mode for dual-band WLAN transceivers.

As shown in FIG. 4, switch 255 (shown in closed switch position) is included in RF Front-End circuitry 222, so as to select the configuration corresponding to the 2G RX mode. In this configuration, the RF Front-End circuitry 222 receives an incoming RF signal from antenna 243 for a specific frequency band, within the wireless transceiver capabilities, such as 2 GHz. The incoming signals are received by the antenna 243 via a wireless communication connection to a wireless network, for example a WLAN. Responsive to selecting the 2G RX mode, or otherwise turning switch 255 ON, a signal path is formed connecting the RF Front-End circuitry 222 between 2G LNA 250 and antenna 243.

The 2G receive path, or receiving path, of the RF Front-End circuitry 222 in 2G RX mode configuration couples inductor 260 in series with 2G LNA 250. Furthermore, the 2G receiving path is configured so that the inductor 260 is coupled in series with the inductor 244. The inductor 244 is a passive component included in tunable harmonic filtering circuitry, as shown in FIG. 3, and is further connected to variable capacitor 242, coupled in series to ground 233. As illustrated in FIG. 3 and FIG. 4, the RF Front-End circuitry 222 is configured to share passive components among operation modes, for example some of the same passive components are used irrespective of whether the RF Front-End is configured for operation in TX mode or RX mode, thereby reducing circuit area on the integrated circuit.

According to an embodiment, inductor 260 and inductor 244 are coupled in series as seen in FIG. 4, and are configured to provide impedance matching for the 2G LNA 250. The 2G receiving path routes a signal in the 2 GHz frequency band from the matching inductor 260 to 2G LNA 250 of the RF Front-End circuitry 222. RF Front-End circuitry 222 is configured to condition (e.g., down convert) an incoming RF signal, and the 2G receiving path provides a complete circuit path between the antenna 243 and the 2G LNA 250. Therefore, when the receiving path of the RF Front-End circuitry 222 is configured for operation in the 2G RX mode, according to an embodiment, a WLAN transceiver implementing RF Front-End 222 is able to receive and further process 2G signals.

Figure 5:
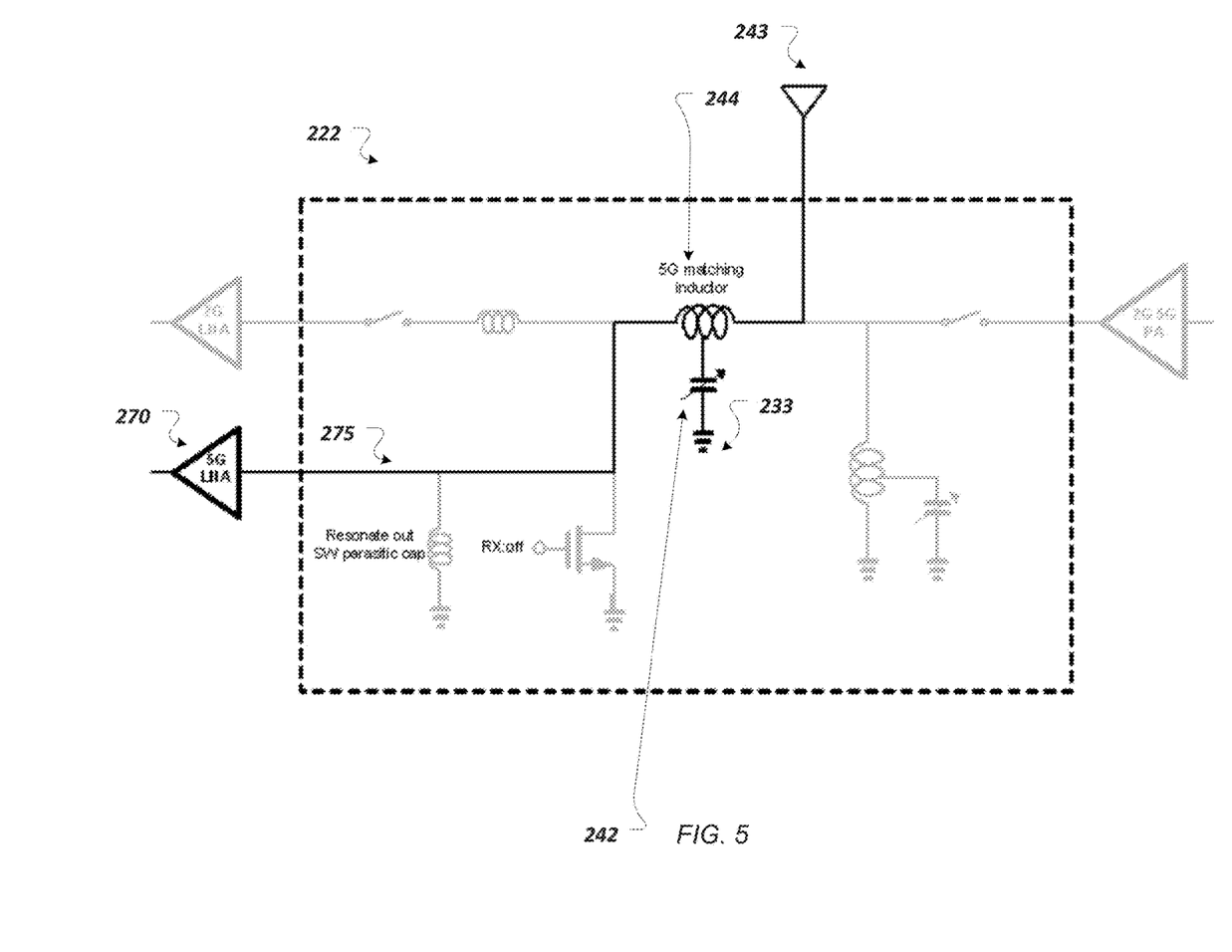
FIG. 5 shows of a circuit configuration of a reconfigurable integrated RF Front-End in another frequency band receive mode for dual-band WLAN transceivers.

Referring now to FIG. 5, an example RF Front-End circuitry 222 operating in 5G RX mode is illustrated. Switch 275 is shown in a closed or ON switch position. In this configuration, the RF Front-End circuitry 222 is implemented to receive an incoming RF signal from antenna 243 for a specific frequency band, for example 5 GHz. An incoming signal is received by the antenna 243 via a communications connection to a wireless network, such as a WLAN. In response to turning ON, switch 275, a receiving signal path is formed connecting the RF Front-End circuitry 222 between 5G LNA 270 and antenna 243. The receiving path, of the RF Front-End circuitry 222 in 5G RX mode configuration is further configured to include inductor 244, which also selectively serves 2G RX mode as well as TX mode, coupled in series with antenna 243. It is further noted variable capacitor 242, which is coupled in series with ground 233, is also disposed in the 5G receiving path.

In this implementation, the 5 GHz receive path couples inductor 244 with 5G LNA 270, in series. The inductor 244 provides 5G impedance matching for 5G LNA 270. Impedance matching is provided so as to transfer the maximum amount of power from a source to a load, where the load impedance should match the RF energy source impedance. In the example shown in FIG. 5, the load impedance for amplifier 5G LNA 270 is configured to match the impedance of the RF source for the RF Front-End circuitry 22, which is antenna 243. Inductors and capacitors have impedances with opposing signs. Thus variable capacitor 242 and inductor 244, operating at appropriate capacitance and inductance values respectively, will adjust impedance of the load at 5G LNA 270 to match that of antenna 243. Additionally, the inductor 244 is implemented as a passive component included in tunable harmonic filtering circuitry, as shown in FIG. 3. In the 5G RX mode configuration, the NMOS transistor, as shown in FIG. 2, is switched to OFF thereby isolating the 5G receive path from ground downstream of inductor 244. In the 5G RX mode, as illustrated in FIG. 5, the switches associated with TX mode and 2G RX mode are "OFF". Consequently, the components of the RF Front-End circuitry 222 utilized for those modes respectively (shown in FIGS. 3-4) have no loading on the circuitry while in the 5G RX configuration.

RF Front-End circuitry 222 is configurable to condition a RF signal received by antenna 243, and provide the signal to 5G LNA 270 as suitable input for further processing by the wireless transceiver. The 5G receive path provides a complete circuit path between the antenna 243 and the 5G LNA 270. The receive path, for the RF Front-End circuitry 222 configuration of FIG. 5 supports a WLAN transceiver that is operative to receive a signal in the 5 GHz band.

FIG. 6 shows a capbank circuitry 600, or capacitor bank, that is usable as a circuit element in the RF Front-End circuitry 222. The capbank circuitry 600, as shown in FIG. 6, is implemented as an array of floating NMOS devices coupled to ground 640. The capbank circuitry 600 is employed by the RF Front-End for frequency tuning during transmission operations, in an embodiment. For example, the capbank circuitry 600 is configured for tuning the tunable harmonic trap filters to a particular frequency band (e.g., 2 GHz or 5 GHz) based on the selected operational mode. As discussed in detail in reference to FIG. 2 capacitors are employed to control certain aspects of tunability for harmonic trap filters. Utilizing capbanks, such as the capbank circuitry 600, can provide greater accuracy in tunability of the filter. For instance, each capacitor in the bank functions as a controlling component, providing a filter that is tuned to the center frequency and passable bandwidth for a number of different circuit states (e.g., various applied signal voltages). The various states in which the filter can suitably tune corresponds to the number of active capacitors in the bank, where an increased number of capacitors generally yields finer tuning of the filter. That is, increasing the capacitors included in capbank circuitry 600 increases the accuracy of tuning between 2 GHz and 5 GHz bands.

The capbank circuitry 600, according to the implementation, includes at least one capacitor 620, and a plurality of NMOS transistors 650, three are seen. In some implementations, capbank circuitry 600 includes capacitors 620 coupled with bipolar junction transistors (BJTs). Accordingly, the capbank circuitry 600 is configured to operate as a switched capacitor, which is further operable to support frequency tuning for the embodiments. As an example, when a bias voltage is applied to the NMOS transistor 650 causing the transistor to function as an "ON" switch, the transistor forms a low impedance path to ground at certain frequencies. Alternatively, the NMOS transistor 650 is switched to allow a signal to propagate to another capacitor in the bank.

Thus, NMOS transistors 650 function as switches within the filter, resulting in discrete or variable changes in a passband filter response. For instance, in TX operation mode for the RF Front-End circuitry (shown in FIG. 3), one of the NMOS transistors 650 are toggled between the OFF/ON positions and thereby vary the capacitance associated with capbank circuitry 600 elements, and subsequently changing the tuning range of the filter for example. Further details regarding capacitance and tunable harmonic trap filter operation is discussed in reference to FIG. 2.

In some implementations, the capbank circuitry 600 includes a grouping of capacitors identical to capacitor 620. In this configuration, the capacitors are connected in parallel with one another and employed to provide tuning between the frequency bands (i.e., 2 GHZ and 5 GHz). It is noted that the number of devices utilized for implementing the capbank circuitry 600 is adjustable for desired voltage swing levels. The number of capacitors used in capbank circuitry 600, and in turn, the capacitance introduced into the Front-End circuitry adjusts impedance along a signal path. The impedance associated with the capbank circuitry 600 is usable to compensate for the fluctuations in voltage due to voltage swing at higher operational frequencies, thereby increasing circuit stability. Moreover, in some implementations, the capbank circuitry 600 is designed to withstand high voltage swings during TX mode, which results in little or negligible stress on transistors resulting from overdriving the transistors (e.g., excess gate voltage).

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more processors to perform the operations described (such as a program encoded in a computer-readable medium, which can be a memory device, a storage device, a machine-readable storage substrate, or other physical, machine-readable medium, or a combination of one or more of them).

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An integrated circuit chip comprising:
 radio frequency (RF) Front-End circuitry, wherein the RF Front-End circuitry comprises (i) an antenna input line configured to connect with one or more antennas of a wireless communication device, (ii) a transmitter input line, (ii) a first receiver output line, (iii) and a second receiver output line;
 harmonic trap circuitry coupled with the RF Front-End circuitry via the antenna input line, the harmonic trap circuitry being fully integrated on the integrated circuit chip;
 a transmitter configuration switch coupled between the harmonic trap circuitry and the RF Front-End circuitry via the transmitter input line, wherein the transmitter configuration switch is selectable to configure the integrated circuit chip for transmitting by connecting the transmitter input line with the antenna input line and the harmonic trap circuitry;
 a first receiver configuration switch coupled between the harmonic trap circuitry and the RF Front-End circuitry via the first receiver output line, wherein the first receiver configuration switch is selectable to configure the integrated circuit chip for receiving by connecting the first receiver output line with the harmonic trap circuitry and the antenna input line; and
 a second receiver configuration switch coupled between the harmonic trap circuitry and the RF Front-End circuitry via the second receiver output line, wherein the second receiver configuration switch is selectable to configure the integrated circuit chip for receiving by connecting the second receiver output line with the harmonic trap circuitry and the antenna input line.

2. The integrated circuit chip of claim 1, wherein the harmonic trap circuitry comprises a first harmonic trap filter and a second harmonic trap filter, wherein the first harmonic trap filter is coupled between the transmitter configuration switch and the antenna input line, wherein the second harmonic trap filter is coupled between the antenna input line and the first and second receiver configuration switches, and the integrated circuit chip comprises:
 an inductor coupled in series between the second harmonic trap filter and the first receiver configuration switch; and
 an additional switch coupled between the second harmonic trap filter and ground;
 wherein the additional switch is turned on when the integrated circuit chip is configured for transmitting, and the additional switch is turned off when the integrated circuit chip is configured for receiving.

3. The integrated circuit chip of claim 2, wherein the additional switch is an N-type metal-oxide-semiconductor (NMOS) transistor, the inductor coupled in series between the second harmonic trap filter and the first receiver configuration switch is a first inductor, and the integrated circuit chip comprises a second inductor coupled between the second harmonic trap filter and the second receiver configuration switch, the second inductor coupled in series with ground.

4. The integrated circuit chip of claim 2, wherein each of the first and second harmonic trap filters is a tunable harmonic trap filter.

5. The integrated circuit chip of claim 4, wherein each tunable harmonic trap filter comprises one or more variable capacitors, and the variable capacitors of the first and second harmonic trap filters are configured to provide tuning for both 2 GHz and 5 GHz transmission signals.

6. The integrated circuit chip of claim 4, wherein the tunable harmonic trap filters comprise an array of floating NMOS devices used to reduce voltage stress during transmitting.

7. The integrated circuit chip of claim 2, wherein the inductor coupled in series between the second harmonic trap filter and the first receiver configuration switch is a first inductor, and the second harmonic trap filter comprises:
 a second inductor coupled in series between the first inductor and the antenna input line; and
 a variable capacitor coupled with the second inductor and with ground.

8. The integrated circuit chip of claim 7, wherein the first harmonic trap filter comprises:
 a third inductor coupled in series between the antenna input line and ground; and
 a variable capacitor coupled with the third inductor and with ground.

9. The integrated circuit chip of claim 1, wherein the integrated circuit chip comprises a Complimentary-Metal-Oxide-Semiconductor (CMOS) die.

10. The integrated circuit of chip 1, wherein the RF Front-End circuitry comprises a power amplifier connected with the transmitter input line, a first low-noise amplifier connected with the first receiver output line, and a second low-noise amplifier connected with the second receiver output line.

11. A wireless communication device comprising:
 one or more antennas;
 a power amplifier;
 a first low-noise amplifier;
 a second low-noise amplifier; and
 integrated device circuitry providing (i) a transmitting path coupling the power amplifier to the one or more antennas, (ii) a first receiving path coupling the one or more antennas to the first low-noise amplifier, and (ii) a second receiving path coupling the one or more antennas to the second low-noise amplifier;
 wherein the transmitting path comprises a transmitter configuration switch, a first harmonic trap filter, a second harmonic trap filter, and an additional switch, wherein the transmitter configuration switch is selectable to activate the transmitting path;
 wherein the first receiving path comprises a first receiver configuration switch and the second harmonic trap filter, wherein the first receiver configuration switch is selectable to activate the first receiving path; and
 wherein the second receiving path comprises a second receiver configuration switch and the second harmonic trap filter, wherein the second receiver configuration switch is selectable to activate the second receiving path.

12. The wireless communication device of claim 11, wherein the transmitting path is further coupling the first harmonic trap filter between the transmitter configuration switch and the one or more antennas;
 wherein the first and the second receiving paths are further coupling the second harmonic trap filter between the one or more antennas and the first and second receiver configuration switches;
 wherein the first receiving path further comprises an inductor, and is further coupling the inductor in series between the second harmonic trap filter and the first receiver configuration switch;

wherein the transmitting path is further coupling the additional switch between the second harmonic trap filter and ground; and wherein the additional switch is turned on when the integrated device circuitry is configured for activating the transmitting path, and the additional switch is turned off when the integrated device circuitry is configured for activating the first receiving path or the second receiving path.

13. The wireless communication device of claim 12, wherein the additional switch is an N-type metal-oxide-semiconductor (NMOS) transistor, the inductor coupled in series between the second harmonic trap filter and the first receiver configuration switch is a first inductor, and the second receiving path comprises a second inductor and is further coupling the second inductor between the second harmonic trap filter and the second receiver configuration switch, the second inductor being coupled in series with ground.

14. The wireless communication device of claim 12, wherein each of the first and second harmonic trap filters is a tunable harmonic trap filter.

15. The wireless communication device of claim 14, wherein each tunable harmonic trap filter comprises one or more variable capacitors, and the variable capacitors of the first and second harmonic trap filters are configured to provide tuning for both 2 GHz and 5 GHz transmission signals.

16. The wireless communication device of claim 14, wherein the tunable harmonic trap filters comprise an array of floating NMOS devices used to reduce voltage stress during transmitting.

17. The wireless communication device of claim 12, wherein the inductor coupled in series with the second harmonic trap filter and the first receiver configuration switch is a first inductor, and the second harmonic trap filter comprises:

a second inductor, wherein the first receiving path is further coupling the second inductor in series between the first inductor and the one or more antennas; and a variable capacitor coupled between the second inductor and ground.

18. The wireless communication device claim 17, wherein the first harmonic trap filter comprises:

a third inductor, wherein the transmitting path is further coupling the third inductor in series between the one or more antennas and ground; and a variable capacitor coupled between the third inductor and ground.

19. The wireless communication device of claim 11, wherein the integrated device circuitry comprises a Complimentary-Metal-Oxide-Semiconductor (CMOS) die.

* * * * *